(12) United States Patent
Hazeyama

(10) Patent No.: US 10,896,827 B2
(45) Date of Patent: Jan. 19, 2021

(54) SUPPORT FOR MANUFACTURING SEMICONDUCTOR PACKAGES, USE OF SUPPORT FOR MANUFACTURING SEMICONDUCTOR PACKAGES, AND METHOD FOR MANUFACTURING SEMICONDUCTOR PACKAGES

(71) Applicant: ZEON CORPORATION, Tokyo (JP)

(72) Inventor: Ichiro Hazeyama, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 16/306,959

(22) PCT Filed: Jun. 19, 2017

(86) PCT No.: PCT/JP2017/022504
§ 371 (c)(1),
(2) Date: Dec. 4, 2018

(87) PCT Pub. No.: WO2018/003565
PCT Pub. Date: Jan. 4, 2018

(65) Prior Publication Data
US 2019/0148175 A1    May 16, 2019

(30) Foreign Application Priority Data
Jun. 28, 2016   (JP) .................. 2016-128055

(51) Int. Cl.
*H01L 21/56* (2006.01)
*C09J 201/00* (2006.01)
(Continued)

(52) U.S. Cl.
CPC ............ *H01L 21/568* (2013.01); *C09J 7/241* (2018.01); *C09J 7/25* (2018.01); *C09J 201/00* (2013.01);
(Continued)

(58) Field of Classification Search
CPC ........ H01L 21/568; H01L 21/52; H01L 21/56; H01L 21/78; H01L 2224/97;
(Continued)

(56) References Cited

U.S. PATENT DOCUMENTS

| 6,883,938 B1 * | 4/2005 | Kohara | ............. F21V 7/28 362/296.04 |
| 2008/0013177 A1 * | 1/2008 | Hatano | ............. G02B 1/116 359/586 |

(Continued)

FOREIGN PATENT DOCUMENTS

| JP | 2001332647 A | 11/2001 |
| JP | 2002249553 A | 9/2002 |

(Continued)

OTHER PUBLICATIONS

Aug. 8, 2017, International Search Report issued in the International Patent Application No. PCT/JP2017/022504.
(Continued)

*Primary Examiner* — Selim U Ahmed
(74) *Attorney, Agent, or Firm* — Kenja IP Law PC

(57) ABSTRACT

To provide a support for manufacturing semiconductor packages which has excellent durability in treatments such as polishing, heating, exposing/developing, plating, and vacuuming; a use of the support for manufacturing semiconductor packages; and a method of manufacturing semiconductor packages. The support includes a substrate layer and an adhesive layer adjacent to the substrate layer, wherein the substrate layer is formed of an alicyclic structure-containing resin film.

6 Claims, 3 Drawing Sheets

(51) Int. Cl.
  *H01L 21/52*    (2006.01)
  *C09J 7/24*    (2018.01)
  *C09J 7/25*    (2018.01)
  *H01L 21/78*    (2006.01)

(52) U.S. Cl.
  CPC .............. *H01L 21/52* (2013.01); *H01L 21/56* (2013.01); *H01L 21/78* (2013.01); *C09J 2203/326* (2013.01); *H01L 21/561* (2013.01); *H01L 2224/97* (2013.01)

(58) Field of Classification Search
  CPC ....... H01L 21/561; C09J 7/241; C09J 201/00; C09J 7/25; C09J 2203/326
  See application file for complete search history.

(56) References Cited

U.S. PATENT DOCUMENTS

| | | | |
|---|---|---|---|
| 2011/0073901 A1* | 3/2011 | Fujita | C09J 7/24 257/100 |
| 2011/0316152 A1 | 12/2011 | Miki et al. | |
| 2013/0217186 A1 | 8/2013 | Tani et al. | |
| 2014/0091455 A1* | 4/2014 | Strothmann | H01L 21/6836 257/734 |

FOREIGN PATENT DOCUMENTS

| | | |
|---|---|---|
| JP | 2007016102 A | 1/2007 |
| JP | 2010083939 A | 4/2010 |
| JP | 2012015191 A | 1/2012 |
| JP | 2012104757 A | 5/2012 |
| JP | 2013168541 A | 8/2013 |
| WO | 2012033076 A1 | 3/2012 |
| WO | 2013175987 A1 | 11/2013 |

OTHER PUBLICATIONS

Jan. 1, 2019, International Preliminary Report on Patentability issued in the International Patent Application No. PCT/JP2017/022504.

* cited by examiner

SUPPORT FOR MANUFACTURING SEMICONDUCTOR PACKAGES, USE OF SUPPORT FOR MANUFACTURING SEMICONDUCTOR PACKAGES, AND METHOD FOR MANUFACTURING SEMICONDUCTOR PACKAGES

TECHNICAL FIELD

The present disclosure relates to supports for manufacturing semiconductor packages, uses of supports for manufacturing semiconductor packages, and methods for manufacturing semiconductor packages.

BACKGROUND

Wafer level chip scale packages (WLCSPs), also called fan-in wafer level packages (FIWLPs), have been known as one type of semiconductor packages.

WLCSPs are semiconductor packages obtained by fabricating redistribution layers in semiconductor chips formed on a wafer and singulating the dies. In the WLCSP the package area and the semiconductor chip area are the same, resulting in the problem of limited number of external connection terminals to be mounted.

Recently, fan-out wafer level packages (hereinafter also referred to as "FOWLPs") have been proposed as a means for solving this problem.

FOWLPs are generally obtained by singulating semiconductor chips fabricated on a wafer, rearranging the chips on a support, subjecting the obtained laminate sealed with resin to various treatments, and singulating the dies. In the FOWLP the package area is larger than the semiconductor chip area thus allowing external connection terminals to be mounted also in the outer region of the semiconductor chip.

For example, PTL 1 discloses a method of manufacturing semiconductor packages which includes: a first step of forming a support in which a plurality of reference mark transfer portions is formed on one side; a second step of disposing semiconductor chips such that their circuit formation surface faces the one side; a third step of forming on the one side sealing resin that covers the semiconductor chips and the plurality of reference mark transfer portions so as to transfer the plurality of reference mark transfer portions to a main surface of the sealing resin that makes contact with the support, thereby forming a plurality of reference marks on the main surface; a fourth step of removing the support to expose the circuit formation surface and the main surface; and a fifth step of forming on the circuit formation surface and the main surface interconnection structures which include interconnection layers electrically connected to the semiconductor chips, based on the plurality of reference marks.

PTL 2 discloses a method of manufacturing semiconductor devices which includes: disposing an adhesive layer on a support; disposing semiconductor elements on the adhesive layer; disposing a resin layer on the adhesive layer on which the semiconductor elements are disposed, to form on the adhesive layer a substrate that includes the semiconductor elements and the resin layer; and separating the substrate from the adhesive layer, wherein the adhesion force of the adhesive layer in the direction in which the substrate is separated is weaker than the adhesion force in the plane direction in which the substrate is formed.

PTL 2 also discloses disposing the semiconductor elements such that their circuit formation surface (electrode surface) faces the adhesive layer provided on the support.

PTL 3 discloses a method of manufacturing semiconductor packages which includes: placing a plurality of semiconductor chips in recesses of a support with electrode surfaces facing upward in a state where the semiconductor chips are arranged separately from each other; forming a seal resin part by sealing the semiconductor chips with insulating resin on the support; forming rewiring patterns on a top surface of the seal resin part; forming external connection terminals on the rewiring patterns; removing bottom parts of the recesses of the support from the seal resin part while maintaining reinforcing members of the support to be remained; and singulating the semiconductor packages by cutting the seal resin part along the outside of the reinforcing members.

As described above, the semiconductor package manufacturing method of PTL 3 involves placing semiconductor chips on a support such that the surface that faces away from the electrode surface faces the support unlike the manufacturing methods of PTLS 1 and 2.

CITATION LIST

Patent Literature
 [PTL 1] JP2012104757A
 [PTL 2] JP2013168541A
 [PTL 3] JP2012015191A

SUMMARY

Technical Problem

As described in PTLS 1 to 3, manufacture of FOWLPs generally involves disposing semiconductor chips on a support having such a substrate layer as a metal, glass or silicon substrate layer and sealing the components with resin to form a laminate. After optional polishing, heating, exposing/developing, plating, vacuuming and/or other treatments, the laminate is singulated into individual FOWLPs.

From the viewpoint of cost and mass, it is preferred to replace the support described above with one having a resin substrate layer. However, supports having a resin substrate layer show poor durability in the treatments described above and hence it was practically necessary to use supports having a metal substrate layer or the like.

The present disclosure was made in light of the circumstance described above and an object of the present disclosure is to provide a support for manufacturing semiconductor packages which has excellent durability in treatments such as polishing, heating, exposing/developing, plating, and vacuuming; a use of the support for manufacturing semiconductor packages; and a method of manufacturing semiconductor packages.

Solution to Problem

The inventors made extensive studies to solve the foregoing problem. As a result, they discovered that a support having a substrate layer made of alicyclic structure-containing resin has excellent durability in polishing, heating, exposing/developing, plating and vacuuming, and completed the present disclosure.

Thus, according to the present disclosure, there are provided a support for manufacturing semiconductor packages according to [1] below; a use of the support for manufacturing semiconductor packages according to [2] below; and methods of manufacturing semiconductor packages according to [3] to [6] below.

[1] A support for manufacturing semiconductor packages, comprising:
   a substrate layer; and
   an adhesive layer adjacent to the substrate layer,
   wherein the substrate layer is formed of an alicyclic structure-containing resin film.

[2] A use of the support according to [1] for the manufacture of fan-out wafer level packages.

[3] A method of manufacturing semiconductor packages, comprising:
   step (α) wherein a plurality of semiconductor chips is disposed on the adhesive layer of the support according to [1] and sealed with resin to form a laminate in which a resin layer having the plurality of semiconductor chips is formed on the support; and
   step (β) wherein the laminate obtained in the step (α) is subjected to at least one treatment selected from the group consisting of polishing, heating, exposing/developing, plating, and vacuuming.

[4] The method according to [3], further comprising:
   step (γ) wherein after the step (β) the support and the resin layer having the plurality of semiconductor chips which constitute the laminate are separated from each other, and the resin layer having the plurality of semiconductor chips is subjected backside treatment and singulation to manufacture semiconductor packages.

[5] The method according to [3], comprising the following step (δ) performed at least once after the step (β):
   step (δ) wherein the support and the resin layer having the plurality of semiconductor chips which constitute the laminate are separated from each other, another support for manufacturing semiconductor packages is attached to the resin layer to provide a laminate, and the laminate is subjected to at least one treatment selected from the group consisting of polishing, heating, exposing/developing, plating, and vacuuming.

[6] The method according to [5], further comprising the following step (ε):
   step (ε) wherein after the step (δ) the support and the resin layer having the plurality of semiconductor chips which constitute the laminate are separated from each other, and the resin layer is subjected to backside treatment and singulation to manufacture semiconductor packages.

Advantageous Effect

According to the present disclosure, there are provided a support for manufacturing semiconductor packages which has excellent durability in treatments such as polishing, heating, exposing/developing, plating, and vacuuming; a use of the support for manufacturing semiconductor packages; and a method of manufacturing semiconductor packages.

BRIEF DESCRIPTION OF THE DRAWINGS

In the accompanying drawing.

DETAILED DESCRIPTION

Figure 1A:
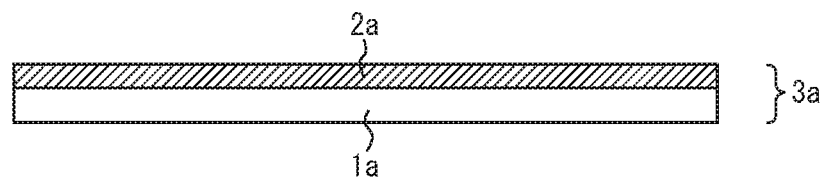
FIGS. 1A to 1C schematically show a manufacturing process of a laminate.

The present disclosure will now be described in detail based on the chapters titled "1) Support for Manufacturing Semiconductor Packages" and "2) Use of Support for Manufacturing Semiconductor Packages, and Method of Manufacturing Semiconductor Packages".

1) Support for Manufacturing Semiconductor Packages

The support for manufacturing semiconductor packages of the present disclosure includes a substrate layer and an adhesive layer adjacent to the substrate layer, wherein the substrate layer is formed of an alicyclic structure-containing resin film.

[Substrate Layer]

The substrate layer constituting the support for manufacturing semiconductor packages of the present disclosure is formed of an alicyclic structure-containing resin film.

The alicyclic structure-containing resin film comprises an alicyclic structure-containing polymer as a resin component. The alicyclic structure-containing polymer has an alicyclic structure in the main chain and/or the side chain. Preferred is such an alicyclic structure-containing polymer that has an alicyclic structure in the main chain because it is possible to form a support which is more excellent in mechanical strength, heat resistance, chemical resistance, low water absorption and other characteristics.

Examples of the alicyclic structure include a saturated, cyclic hydrocarbon (cycloalkane) structure and an unsaturated, cyclic hydrocarbon (cycloalkene) structure. Preferred is a cycloalkane structure because a support that has excellent mechanical strength, heat resistance, chemical resistance, low water absorption and other characteristics is easily obtained.

The alicyclic structure may have any number of carbon atoms, but typically 4 to 30, preferably 5 to 20, more preferably 5 to 15, and particularly preferably 7 to 9 carbon atoms. When the number of carbon atoms of the alicyclic structure falls within these ranges, a support is easily obtained that has mechanical strength, heat resistance, chemical resistance, low water absorption and other characteristics in a more balanced manner.

The proportion of the repeat unit having an alicyclic structure in the alicyclic structure-containing polymer can be appropriately selected. This repeat unit generally accounts for at least 30% by mass, preferably at least 50% by mass, more preferably at least 70% by mass, of the total repeat units. When the proportion of the repeat unit having an alicyclic structure in the alicyclic structure-containing polymer is 30% by mass or more, a support is easily obtained that has more excellent mechanical strength, heat resistance, chemical resistance, low water absorption and other characteristics. The remainder other than the repeat unit having an alicyclic structure in the alicyclic structure-containing polymer is not particularly limited and is appropriately selected.

The weight average molecular weight (Mw) of the alicyclic structure-containing polymer is not particularly limited, but is usually 5,000 to 500,000, preferably 8,000 to 200,000, more preferably 10,000 to 100,000, particularly preferably 10,000 to 30,000. When the weight average molecular weight (Mw) of the alicyclic structure-containing polymer falls within the ranges described above, various characteristics such as mechanical strength of the support and the work efficiency upon production of the alicyclic structure-containing resin film are achieved in a more balanced manner.

The molecular weight distribution (Mw/Mn) of the alicyclic structure-containing polymer is not particularly limited, but is usually 1.0 to 4.0, preferably 1.0 to 3.5, more preferably 1.0 to 3.0, particularly preferably 1.0 to 2.5.

The weight average molecular weight (Mw) and the number average molecular weight (Mn) of the alicyclic structure-containing polymer can be determined according to the method described in Examples.

The glass transition temperature (Tg) of the alicyclic structure-containing polymer is not particularly limited, but is usually 90° C. to 200° C., preferably 90° C. to 170° C.

When the alicyclic structure-containing polymer has a glass transition temperature (Tg) of 90° C. or higher, a support having excellent heat resistance is easily obtained. Further, because alicyclic structure-containing polymers having a glass transition temperature (Tg) of 200° C. or below show sufficient fluidity when melted and therefore excellent moldability, they provide excellent work efficiency when producing alicyclic structure-containing resin films.

The glass transition temperature (Tg) can be measured according to JIS K 6911.

Specific examples of alicyclic structure-containing polymers include (1) norbornene polymers, (2) monocyclic olefin polymers, (3) cyclic conjugated diene polymers, and (4) vinyl alicyclic hydrocarbon polymers, with norbornene polymers being preferred because a support having excellent mechanical strength, heat resistance, chemical resistance, low water absorption and other characteristics is easily obtained.

These polymers herein refer not only to polymerization reaction products, but also to hydrogenated products thereof.

(1) Norbornene Polymers

Norbornene polymers are polymers obtained by polymerizing norbornene monomers (monomers having a norbornene skeleton), or hydrogenated products thereof.

Examples of norbornene polymers include ring-opened polymers of norbornene monomers; ring-opened polymers of norbornene monomers and other monomers capable of undergoing ring-opening copolymerization with the norbornene monomers; hydrogenated products of these ring-opened polymers; addition polymers of norbornene monomers; and addition polymers of norbornene monomers and other monomers copolymerizable with the norbornene monomers.

Examples of norbornene monomers include bicyclo [2.2.1]hept-2-ene (common name: norbornene) and derivatives thereof (derivatives refer to those having substituent(s) on the ring), tricyclo[4.3.0$^{1,6}$.1$^{2,5}$]deca-3,7-diene (common name: dicyclopentadiene) and derivatives thereof, tetracyclo [9.2.1.0$^{2,10}$.0$^{3,8}$]tetradeca-3,5,7,12-tetraene (also referred to as methanotetrahydrofluorene, 7,8-benzotricyclo[4.3.0.1$^{2,5}$] deca-3-ene and derivatives thereof, 1,4-methano-1,4,4a,9a-tetrahydrofluorene) and derivatives thereof, tetracyclo [4.4.1$^{2,5}$.1$^{7,10}$.0]dodeca-3-ene (common name: tetracyclododecene) and derivatives thereof.

Examples of substituents include alkyl group, alkylene group, vinyl group, alkoxycarbonyl group, and alkylidene group.

Examples of norbornene monomers having a substituent include 8-methoxycarbonyl-tetracyclo[4.4.0.1$^{2,5}$.1$^{7,10}$]dodeca-3-ene, 8-methyl-8-methoxycarbonyl-tetracyclo [4.4.0.1$^{2,5}$.1$^{7,10}$]dodeca-3-ene, and 8-ethylidene-tetracyclo [4.4.0.1$^{2,5}$.1$^{7,10}$]dodeca-3-ene.

These norbornene monomers can be used singly or in combination of two or more.

Examples of other monomers that can undergo ring-opening copolymerization with norbornene monomers include monocyclic olefin monomers such as cyclohexene, cycloheptene, cyclooctene, and derivatives thereof. Examples of substituents thereon include those exemplified above for norbornene monomers.

Examples of other monomers that can undergo addition copolymerization with norbornene monomers include C2-C20 α-olefins such as ethylene, propylene, 1-butene, 1-pentene and 1-hexene, and derivatives thereof; cycloolefins such as cyclobutene, cyclopentene, cyclohexene and cyclooctene, and derivatives thereof; and non-conjugated dienes such as 1,4-hexadiene, 4-methyl-1,4-hexadiene, 5-methyl-1,4-hexadiene and 1,7-octadiene, and derivatives thereof. Preferred are α-olefins, with ethylene being particularly preferred. Examples of substituents thereon include those exemplified above for norbornene monomers.

Ring-opened polymers of norbornene monomers, or ring-opened polymers of norbornene monomers and other monomers capable of undergoing ring-opening copolymerization with the norbornene monomers can be synthesized by polymerization of the monomer components in the presence of a ring-opening polymerization catalyst known in the art. Examples of ring-opening polymerization catalysts include catalysts consisting of a halide of ruthenium, osmium or other metal and of a nitrate or acetylacetone compound and a reducing agent; and catalysts consisting of a halide of titanium, zirconium, tungsten, molybdenum or other metal or acetylacetone compound and of an organoaluminum compound.

Hydrogenated ring-opened polymers of norbornene monomers can be generally obtained by hydrogenating carbon-carbon unsaturated bonds by adding hydrogenation catalysts known in the art containing a transition metal such as nickel or palladium to polymerization solutions of the ring-opened polymers described above.

Addition polymers of norbornene monomers, or addition polymers of norbornene monomers and other monomers copolymerizable with the norbornene monomers can be synthesized by polymerization of the monomer components in the presence of an addition polymerization catalyst known in the art. Examples of addition polymerization catalysts include catalysts consisting a titanium, zirconium or vanadium compound and of an organoaluminum compound.

Preferred norbornene polymers are hydrogenated ring-opened polymers of norbornene monomers because a support having excellent mechanical strength, heat resistance, chemical resistance, low water absorption and other characteristics is easily obtained.

(2) Monocyclic Olefin Polymers

Examples of monocyclic olefin polymers include addition polymers of monocyclic olefin monomers such as cyclohexene, cycloheptene, and cyclooctene.

These addition polymers can be synthesized as appropriate by methods known in the art.

(3) Cyclic Conjugated Diene Polymers

Examples of cyclic conjugated diene polymers include polymers obtained by 1,2- or 1,4-addition polymerization of cyclic conjugated diene monomers such as cyclopentadiene and cyclohexadiene, and hydrogenated products thereof.

These addition polymers can be synthesized as appropriate by methods known in the art.

(4) Vinyl Alicyclic Hydrocarbon Polymers

Examples of vinyl alicyclic hydrocarbon polymers include polymers of vinyl alicyclic hydrocarbon monomers such as vinyl cyclohexene and vinyl cyclohexane, and hydrogenated products thereof; and polymers of vinyl aromatic monomers such as styrene and α-methyl styrene, where the aromatic ring moiety is hydrogenated. Vinyl alicyclic hydrocarbon polymers can also be copolymers of vinyl alicyclic hydrocarbon monomers or vinyl aromatic monomers and other monomers copolymerizable with these monomers. Examples of such copolymers include random and block copolymers.

These polymers can be synthesized as appropriate by methods known in the art.

A preferred alicyclic structure-containing polymer is one having crystallinity (hereinafter also referred to as "polymer (α)") because a support having more excellent heat resistance and other characteristics can be obtained.

"Crystallinity" refers to a property that a melting point can be measured with a differential scanning calorimeter (DSC) by optimizing measurement conditions, for example; crystallinity is a property determined by the stereoregularity of polymer chains.

Examples of the polymer (a) include syndiotactic stereoregular hydrogenated dicyclopentadiene ring-opened polymers described in WO2012033076A; isotactic stereoregular hydrogenated dicyclopentadiene ring-opened polymers described in JP2002249553A; and hydrogenated norbornene ring-opened polymers described in JP2007016102A.

The melting point of the polymer (α) is preferably 180° C. to 350° C., more preferably 200° C. to 320° C., particularly preferably 220° C. to 300° C., most preferably 240° C. to 290° C.

A polymer (α) having a melting point that falls within this range shows a good balance between characteristics (e.g., heat resistance) and moldability.

A preferred polymer (α) is a syndiotactic stereoregular hydrogenated dicyclopentadiene ring-opened polymer (hereinafter also referred to as "polymer (α1)").

The degree of stereoregularity of the polymer (α1) is not particularly limited, but a polymer (α1) with a higher degree of stereoregularity is preferred because a support that has more excellent mechanical strength, heat resistance, chemical resistance, low water absorption and other characteristics is easily obtained.

Specifically, the proportion of racemo diads for the repeat unit obtained by ring-opening polymerization of dicyclopentadiene followed by hydrogenation is preferably 51% or more, more preferably 60% or more, particularly preferably 70% or more.

Hydrogenated dicyclopentadiene ring-opened polymers with a higher proportion of racemo diads, i.e. a higher degree of syndiotactic stereoregularity, have higher melting points.

The proportion of racemo diads can be measured and quantified by $^{13}$C-NMR spectroscopy. Specifically, $^{13}$C-NMR spectroscopy is carried out by the inverse-gated decoupling method at 150° C. using orthodichlorobenzene-$d_4$ as solvent. With a peak for orthodichlorobenzene-$d_4$ at 127.5 ppm taken as a reference shift, the proportion of racemo diads can be determined based on the intensity ratio of a signal at 43.35 ppm originating from meso diads and a signal at 43.43 ppm originating from racemo diads.

Dicyclopentadiene has two stereoisomers: endo and exo isomers. In the present disclosure, both can be used as a monomer. Alternatively, only one of them may be used, or an isomer mixture comprising any proportions of endo and exo isomers may be used. In the present disclosure, it is preferred to increase the proportion of either one of these stereoisomers because the crystallinity of the polymer (α1) increases and hence a support that has more excellent mechanical strength, heat resistance, chemical resistance, low water absorption and other characteristics is easily obtained. For example, the proportion of the endo or exo isomer is preferably 80% or more, more preferably 90% or more, even more preferably 95% or more, particularly preferably 99% or more. It is preferred that the proportion of the endo isomer is high because synthesis is easy.

When synthesizing the polymer (α1), as a monomer, only dicyclopentadiene may be used or other monomer(s) copolymerizable with dicyclopentadiene may be used. Examples of other monomers include norbornenes other than dicyclopentadiene, cyclic olefins, and dienes.

When other monomers are used, the amount used is preferably 10% by mass or less, more preferably 5% by mass or less, based on the total amount of monomers.

The method for synthesizing the polymer (α1) is not particularly limited and the polymer (α1) can be synthesized by performing a ring-opening polymerization reaction and a hydrogenation reaction according to a known method.

The alicyclic structure-containing resin film may comprise other component(s) such as additives in addition to the alicyclic structure-containing polymer.

Examples of other components include resins other than the alicyclic structure-containing polymer, antioxidants, crystal nucleating agents, fillers, flame retardants, flame retardant aids, colorants, antistatic agents, plasticizers, ultraviolet absorbers, light stabilizers, near-infrared absorbers, and lubricants.

The amount of the alicyclic structure-containing polymer in the alicyclic structure-containing resin film is usually 50% by mass or more, preferably 60% by mass or more, more preferably 80% by mass or more, based on the amount of the alicyclic structure-containing resin film.

The amount of other components can be appropriately determined according to the intended purpose, but it is usually less than 50% by mass, preferably less than 40% by mass, more preferably less than 20% by mass, based on the amount of the alicyclic structure-containing resin film.

The thickness of the alicyclic structure-containing resin film is not particularly limited. The thickness of the alicyclic structure-containing resin film is usually 80 to 1,000 μm, preferably 80 to 500 μm.

[Adhesive Layer]

The adhesive layer constituting the support for manufacturing semiconductor packages of the present disclosure is a layer that is adjacent to the substrate layer and has adhesiveness. It is preferred that the adhesive force of the adhesive layer is adjusted such that the support can be efficiently removed from the laminate by peeling after the support has finished its role while displacement of semiconductor chips can be prevented after they are disposed on the adhesive layer.

The adhesive layer is not particularly limited as long as it has the characteristics described above. For example, the adhesive layer can be formed using adhesives known in the art.

Adhesives can be of any type as long as they have moderate removability. Examples of adhesives include acrylic adhesives, rubber adhesives, and silicone adhesives, with acrylic adhesives being preferred. Active energy ray curable adhesives may also be used.

Examples of acrylic adhesives include those containing as a base polymer an acrylic polymer obtained using one or two or more different (meth)acrylic acid alkyl esters as monomer components.

Acrylic adhesives may comprise additives. Examples of additives include crosslinking agents, tackifiers, plasticizers (e.g. trimellitate ester plasticizers, pyromellitic acid ester plasticizers), pigments, dyes, fillers, anti-aging agents, electrically conductive materials, antistatic agents, ultraviolet absorbers, light stabilizers, release modifiers, softeners, surfactants, flame retardants, and antioxidants.

Examples of rubber adhesives include those containing as a base polymer a natural rubber; a synthetic rubber such as polyisoprene rubber, butadiene rubber, styrene-butadiene (SB) rubber, styrene-isoprene (SI) rubber, styrene-isoprene-styrene block copolymer (SIS) rubber, styrene-butadiene-styrene block copolymer (SBS) rubber, styrene-ethylene-butylene-styrene block copolymer (SEBS) rubber, styrene-ethylene-propylene-styrene block copolymer (SEPS) rubber, styrene-ethylene-propylene block copolymer (SEP) rubber, reclaimed rubber, butyl rubber, polyisobutylene rubber, or modified rubber thereof; or the like.

Rubber adhesives may comprise additives. Examples of additives include crosslinking agents, vulcanizing agents, tackifiers, plasticizers, pigments, dyes, fillers, anti-aging agents, electrically conductive materials, antistatic agents, ultraviolet absorbers, light stabilizers, release modifiers, softeners, surfactants, flame retardants, and antioxidants.

Examples of silicone adhesives include those containing as a base polymer an organopolysiloxane or the like. Silicone adhesives may comprise additives. Examples of additives include crosslinking agents, vulcanizing agents, tackifiers, plasticizers, pigments, dyes, fillers, anti-aging agents, electrically conductive materials, antistatic agents, ultraviolet absorbers, light stabilizers, release modifiers, softeners, surfactants, flame retardants, and antioxidants.

qActive energy ray-curable adhesives are adhesives that cure (have increased elastic modulus) by irradiation with active energy rays and show reduced adhesive force. When the adhesive layer is formed using the active energy ray-curable adhesive, removal of the support by peeling can be effected more efficiently.

Examples of active energy rays include gamma rays, ultraviolet rays, visible rays, infrared rays (heat rays), radio waves, alpha rays, beta rays, electron beams, plasma flows, ionizing rays, and particle beams.

Examples of active energy ray curable adhesives include compositions containing an active energy ray reactive component.

Examples of active energy ray reactive components include photoreactive compounds (monomers, oligomers or polymers) having a functional group having a carbon-carbon multiple bond, such as acryloyl group, methacryloyl group, vinyl group, allyl group or acetylene group; and mixtures of organic salts such as onium salts and compounds having two or more heterocyclic rings in the molecule.

Compositions containing an active energy ray reactive component may comprise other component(s).

Examples of other components include non-photoreactive polymers and additives.

Examples of non-photoreactive polymers include rubber polymers such as natural rubber, polyisobutylene rubber, styrene-butadiene rubber, styrene-isoprene-styrene block copolymer rubber, reclaimed rubber, butyl rubber, polyisobutylene rubber, and nitrile rubber (NBR); silicone polymers; and acrylic polymers.

Examples of additives include active energy ray polymerization initiators, active energy ray polymerization accelerators, crosslinking agents, plasticizers, and vulcanizing agents.

The adhesive layer can be formed for example by preparing a coating liquid by diluting an adhesive with an organic solvent, applying the resulting coating liquid on a substrate layer, and drying the resulting coating film.

Application of the coating liquid can be effected for example using a multi-coater, a die coater, a gravure coater, an applicator or other device.

The method for drying the coating film is not particularly limited and the coating film can be dried by natural drying, heat drying or other method.

The thickness of the adhesive layer is usually 1 to 300 µm, preferably 3 to 300 µm, more preferably 5 to 150 µm, further preferably 10 to 100 µm.

The support for manufacturing semiconductor packages of the present disclosure includes a substrate layer formed of the alicyclic structure-containing resin film. The support of the present disclosure is therefore more advantageously used from the viewpoint of costs and mass compared to other supports having such a substrate layer as a metal, glass or silicon substrate layer.

The support for manufacturing semiconductor packages of the present disclosure has excellent characteristics such as mechanical strength, heat resistance, chemical resistance and low water absorption while it includes a resin film as a substrate layer. Thus, the support is excellent in durability in various treatments during a semiconductor package manufacturing process.

2) Use of Support for Manufacturing Semiconductor Packages and Method of Manufacturing Semiconductor Packages The support for manufacturing a semiconductor package of the present disclosure (hereinafter also referred to as "support of the present disclosure") is suitably used for the manufacture of FOWLPs.

That is, using the support of the present disclosure instead of a support having such a substrate layer as a metal, glass or silicon substrate layer in the conventional FOWLP manufacturing method, FOWLPs can be manufactured more efficiently and inexpensively.

The support of the present disclosure can be used for example in a semiconductor package manufacturing method which comprises the steps described below.

Step (α): A plurality of semiconductor chips is disposed on the adhesive layer of the support of the present disclosure and sealed with resin to form a laminate in which a resin layer having the plurality of semiconductor chips (hereinafter referred to as "semiconductor chip-containing resin layer") is formed on the support of the present disclosure.

Step (β): The laminate obtained in the step (α) is subjected to at least one treatment selected from the group consisting of polishing, heating, exposing/developing, plating, and vacuuming.

The semiconductor chips used in the step (α) can be manufactured by processing a silicon wafer according to the conventional method.

The step (α) can be carried out in the same manner as the step in the conventional FOWLP manufacturing method except that the support of the present disclosure is used t.

The orientation of the semiconductor chips when they are disposed on the adhesive layer can be appropriately determined in consideration of treatments performed during the manufacturing process of semiconductor packages.

For example, the semiconductor chips may be disposed such that the surface on which a redistribution layer is to be formed faces the support (hereinafter referred to as "face down") as described in JP2012104757A and JP2013168541A or may be disposed such that the surface opposite to the surface where a redistribution layer is to be formed faces the support (hereinafter referred to as "face up") as described in JP2012015191A.

Examples of the polishing treatment in the step (β) include treatments performed when planarizing the semiconductor chip-containing resin layer or exposing the semiconductor chips buried in the semiconductor chip-containing resin layer, when the semiconductor chips are disposed face down.

Chemical mechanical polishing (CMP) sometimes uses polishing liquids containing chemical components, which may cause deformation of a support during polishing when the support has a resin substrate layer having poor chemical resistance. Further, when a support is used that has a resin substrate layer having high water absorbency, the substrate layer which has absorbed moisture may swell during polishing and hamper precise processing.

On the other hand, the substrate layer constituting the support of the present disclosure is formed of the alicyclic structure-containing resin film. Because the alicyclic structure-containing resin has excellent chemical resistance and low water absorption, these problems can be solved by using the support of the present disclosure.

Examples of the heat treatment in the step ($\beta$) include heat treatment to effect a curing reaction when the semiconductor chip-containing resin layer contains a thermosetting resin, and heat treatment to effect a curing reaction of thermosetting resin upon formation of an insulating portion in the redistribution layer when semiconductor chips are disposed face up.

A support with a resin substrate layer having poor heat resistance may not be able to withstand these heat treatments.

On the other hand, the substrate layer constituting the support of the present disclosure is formed of the alicyclic structure-containing resin film. Because the alicyclic structure-containing resin has excellent heat resistance, this problem can be solved by using the support of the present disclosure.

Examples of the exposure/development treatment and plating treatment in the step ($\beta$) include those for forming a conductor portion in the redistribution layer when semiconductor chips are disposed face up.

Because these treatments generally involve contacting the laminate with chemicals or heating the laminate, the support may deform or swell depending on the resin component of the substrate layer of the support.

On the other hand, the substrate layer constituting the support of the present disclosure is formed of the alicyclic structure-containing resin film. Because the alicyclic structure-containing resin has excellent chemical resistance, low water absorption and heat resistance, these problems can be solved by using the support of the present disclosure.

Examples of the vacuum treatment in the step ($\beta$) include those associated with a sputtering process for forming a conductor in the redistribution layer when semiconductor chips are disposed face up.

When vacuum treatment is performed using a support having a water-absorptive resin substrate layer, moisture may be released from the substrate layer during the vacuum treatment and contaminate the semiconductor chips.

On the other hand, the substrate layer constituting the support of the present disclosure is formed of the alicyclic structure-containing resin film. Because the alicyclic structure-containing resin has excellent low water absorption, this problem can be solved by using the support of the present disclosure.

After the step ($\beta$), the support is usually separated from the laminate, and the exposed surface (the surface opposite to the surface processed in the step ($\beta$) is subjected to backside treatment and the like.

That is, after the step ($\beta$), the following step ($\gamma$) is usually performed: Step ($\gamma$): After the step ($\beta$), the support of the present disclosure and the resin layer having a plurality of semiconductor chips (hereinafter also referred to as "semiconductor chip-containing resin layer") which constitute the laminate are separated from each other, and the resin layer having the plurality of semiconductor chips is subjected backside treatment and singulation to manufacture semiconductor packages.

The backside treatment herein refers to a treatment to be performed on the support side surface of the semiconductor chip-containing resin layer.

For example, when semiconductor chips are disposed face down, examples of the backside treatment include treatment for forming a redistribution layer and treatment for providing an external connection terminal.

When semiconductor chips are disposed face up, examples of the backside treatment include polishing.

These backside treatments can be carried out by methods known in the art. The semiconductor chip-containing resin layer which has undergone backside treatment is then subjected to singulation to provide semiconductor packages.

Singulation can be performed by dicing methods known in the art.

In the semiconductor package manufacturing method of the present disclosure, the following step ($\delta$) may be performed at least once after the step ($\beta$), instead of the step ($\gamma$).

Step ($\delta$): The support of the present disclosure and the resin layer having a plurality of semiconductor chips which constitute the laminate are separated from each other, another support for manufacturing semiconductor packages is attached to the resin layer to provide a laminate, and the laminate is subjected to at least one treatment selected from the group consisting of polishing, heating, exposing/developing, plating, and vacuuming.

As described above, the support of the present disclosure has excellent durability in the various treatments. However, when these treatments are repeated many times, the performance of the support may be deteriorated during the process. In such a case, the step ($\delta$) is performed wherein the support is replaced with a new one so that the semiconductor chip-containing resin layer can be subjected to these treatments again.

Examples of polishing, heating, exposing/developing, plating and vacuuming in the step ($\delta$) include those performed in the step ($\beta$).

When the semiconductor package manufacturing method of the present disclosure includes the step ($\delta$), usually, the following step ($\epsilon$) is performed following the step ($\delta$).

Step ($\epsilon$): After the step ($\delta$), the support of the present disclosure and the resin layer having a plurality of semiconductor chips which constitute the laminate are separated from each other, and the resin layer is subjected to backside treatment and singulation to manufacture semiconductor packages.

The step ($\epsilon$) can be performed as with the step ($\gamma$) except that a laminate subjected to the step ($\delta$) is used.

According to the semiconductor package manufacturing method of the present disclosure which comprises the steps described above, it is possible to manufacture semiconductor packages efficiently and inexpensively.

EXAMPLES

The following provides a more specific description of the present disclosure based on Examples, which however shall not be construed as limiting the scope of the present disclosure. In the following examples, "%" and "part" are based on mass unless otherwise specified.

Measurements in Examples and Comparative Examples were made by the methods described below.

[Glass Transition Temperature and Melting Point]

Differential scanning calorimetry was carried out using a differential scanning calorimeter ("DSC 6220", Hitachi High-Tech Science Co., Ltd.) at a heating rate of 10° C./min to measure the glass transition temperature and melting point of a polymer.

<Weight Average Molecular Weight (Mw) and Molecular Weight Distribution (Mw/Mn)>

The weight average molecular weight (Mw) and molecular weight distribution (Mw/Mn) were determined as values in terms of polystyrene by performing gel permeation chromatography (GPC) at 40° C. using tetrahydrofuran as solvent.

Measurement instrument: gel permeation chromatography (GPC) system "HLC-8220" (Tosoh Corporation)

Column: "H type column" (Tosoh Corporation)

<% Hydrogenation of Unsaturated bonds in Polymer>

% Hydrogenation of unsaturated bonds in a polymer was determined based on $^1$H-NMR measurement.

Production Example 1

Synthesis of Hydrogenated Dicyclopentadiene Ring-Opened Polymer

A pressure reactor made from metal that had been internally purged with nitrogen was charged with 154.5 parts of cyclohexane, 42.8 parts of 70% solution of dicyclopentadiene (≥99% endo isomer content) in cyclohexane (equivalent to 30 parts of dicyclopentadiene) and 1.9 parts of 1-hexene, and the total mass was heated to 53° C.

To a solution prepared by dissolving 0.014 parts of tetrachlorotungstenphenylimide(tetrahydrofuran) complex in 0.70 parts of toluene was added 0.061 parts of 19% solution of diethylaluminumethoxide in n-hexane and stirred for 10 minutes to prepare a catalyst solution. This catalyst solution was added into the reactor and a ring-opening polymerization reaction was carried out for 4 hour at 53° C. to afford a solution containing a dicyclopentadiene ring-opened polymer.

The polymerization reaction was terminated by adding 0.037 parts of 1,2-ethanediol as a terminator into 200 parts of the solution containing a dicyclopentadiene ring-opened polymer and stirring the solution for 1 hour at 60° C. 1 part of a hydrotalcite-like compound (KYOWAAD® 2000 (KYOWAAD is a registered trademark in Japan, other countries, or both); Kyowa Chemical Industry Co., Ltd.) was added and the solution was heated to 60° C. and stirred for 1 hour. 0.4 parts of a filter aid (Radiolite® #1500 (Radiolite is a registered trademark in Japan, other countries, or both); Showa Chemical Industry Co., Ltd.) was added and the adsorbent was filtered off using PP pleated cartridge filter ("TCP-HX", ADVANTEC Toyo Co., Ltd.) to afford a solution containing a dicyclopentadiene ring-opened polymer.

A portion of the resultant solution was used to measure molecular weights of the dicyclopentadiene ring-opened polymer. The dicyclopentadiene ring-opened polymer was found to have a weight average molecular weight (Mw) of 28,100, a number average molecular weight (Mn) of 8,750, and a molecular weight distribution (Mw/Mn) of 3.21.

To 200 parts of the solution containing a dicyclopentadiene ring-opened polymer (polymer content: 30 parts) after purification were added 100 parts of cyclohexane and 0.0043 parts of carbonylchlorohydridotris(triphenylphosphine)ruthenium, and a hydrogenation reaction was performed for 4 hours at a hydrogen pressure of 6 MPa at 180° C. The reaction solution was a slurry liquid containing precipitated solids.

The solids were separated from the liquid by centrifugation of the reaction solution and dried under reduced pressure at 60° C. for 24 hours to afford 28.5 parts of a hydrogenated dicyclopentadiene ring-opened polymer.

The % hydrogenation of unsaturated bonds in the hydrogenation reaction was not less than 99%, the glass transition temperature was 98° C., and the melting point was 262° C.

Production Example 2

Production of Alicyclic Structure-Containing Resin Pellet 100 parts of the hydrogenated dicyclopentadiene ring-opened polymer obtained in Production Example 1 was mixed with 0.8 parts of an antioxidant (tetrakis[methylene-3-(3', 5'-di-t-butyl-4'-hydroxyphenyl)propionate]methane, Irganox® 1010 (Irganox is a registered trademark in Japan, other countries, or both); BASF Japan) and the mixture was loaded into a twin screw extruder (TEM-37B, Toshiba Machine Co., Ltd.). Hot-melt extrusion molding was performed to prepare strands of a shaped article, which were shredded using a strand cutter to provide a pellet.

The operating conditions of the twin screw extruder were as follows:

Barrel set temperature: 270° C. to 280° C.
Die set temperature: 250° C.
Screw rotation rate: 145 rpm
Feeder rotation rate: 50 rpm Production Example 3

Production of Alicyclic Structure-Containing Resin Molded Film

The pellet obtained above was molded under the conditions described below to form a molded film having a width of 120 mm width and a thickness of 400 μm.

Molding machine: hot-melt film extruder (Measuring Extruder Type Me-20/2800V3, Optical Control Systems) equipped with a T-die
Barrel set temperature: 280° C. to 290° C.
Die temperature: 270° C.
Screw rotation rate: 30 rpm
Film take-up rate: 1 m/min Production Example 4

Production of Alicyclic Structure-Containing Resin Film

A part of the obtained molded film was cut out, placed in a small-sized stretching machine ("EX10-B type", Toyo Seiki Seisaku-sho, Ltd.) and subjected to sequential biaxial stretching to afford a stretched film. The stretched film was then fixed to an iron plate and heated in an oven at 200° C. for 20 minutes to afford a resin film having a thickness of 100 μm.

The operation conditions of the small-sized stretching machine were as follows:

Stretching rate: 10,000 mm/min
Stretching temperature: 100° C.

Stretching ratio: ×2.0 in machine direction (MD), ×2.0 in transverse direction (TD)

Production Example 5

Production of Alicyclic Structure-Containing Resin Film

A part of the obtained molded film was cut out, placed in a small-sized stretching machine ("EX10-B type", Toyo Seiki Seisaku-sho, Ltd.) and subjected to sequential biaxial stretching to afford a stretched film. The stretched film was then fixed to an iron plate and heated in an oven at 230° C. for 20 minutes to afford a resin film having a thickness of 200 μm. The operation conditions of the small-sized stretching machine were as follows:
Stretching rate: 10,000 mm/min
Stretching temperature: 130° C.
Stretching ratio: ×1.4 in machine direction (MD), ×1.4 in transverse direction (TD)

Production Example 6

Production of Alicyclic Structure-Containing Resin Film

A part of the obtained molded film was cut out, fixed to a stainless steel frame, and heated in an oven at 240° C. for 20 minutes to afford a resin film having a thickness of 400 μm.

Example 1

After forming an UV curable adhesive layer 2a on one side of the resin film 1a obtained in Production Example 4, the laminate was cut into a circular shape of 150 mm across, and an orientation flat was formed by cutting a part of the edge to prepare a support (A)3a (FIG. 1A). Because this example uses two supports, two identically shaped supports were prepared, which are designated as support (A)3a and support (B)3a.

Figure 1B:
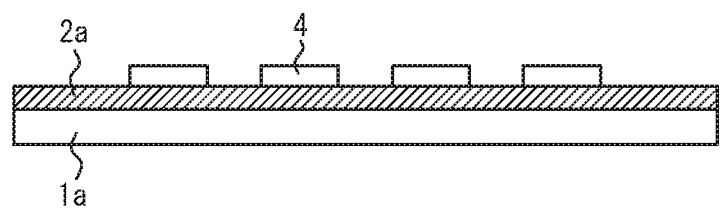
Figure 1C:
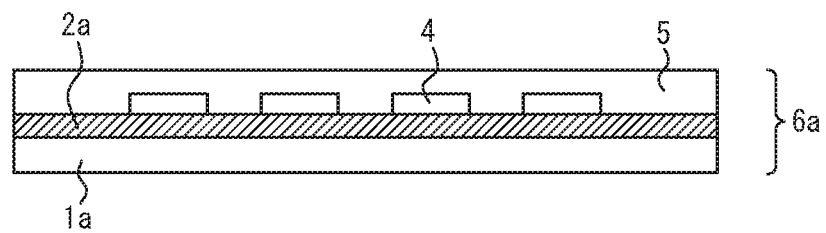

Semiconductor chips 4 were disposed face down on the UV curable adhesive layer of the support (A)3a with reference to the orientation flat [FIG. 1B]. After disposing the semiconductor chips 4, semiconductor sealing epoxy resin was dropped onto the support (A)3a, compression molded at 120° C. for 10 minutes, and cured at 150° C. for 60 minutes to form a molded resin layer 5. In this way a laminate (A)6a was obtained [FIG. 1C].

Figure 2A:
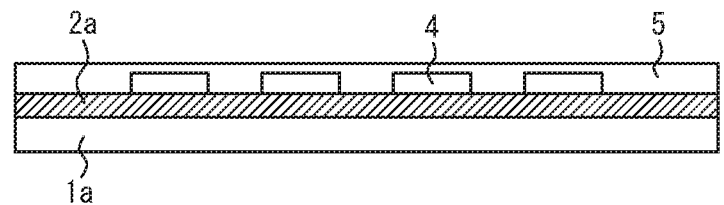
FIGS. 2A to 2F schematically show a first manufacturing process of semiconductor packages.

Next, the molded resin layer of the laminate (A)6a was subjected to slurry polishing, washed with pure water, and dried at 120° C. for 15 minutes [FIG. 2A].

Figure 2B:
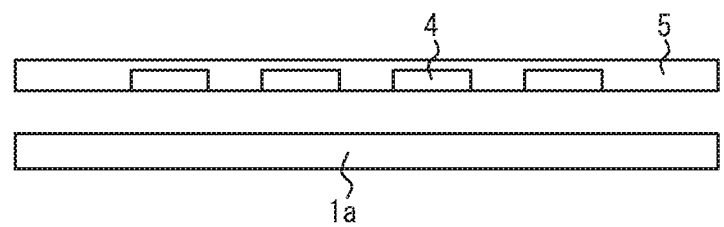

After irradiating the laminate (A)6a with UV light at a dose of 500 mJ/cm² from the support (A)3a side, the support (A)3a was separated [FIG. 2B].

Figure 2C:
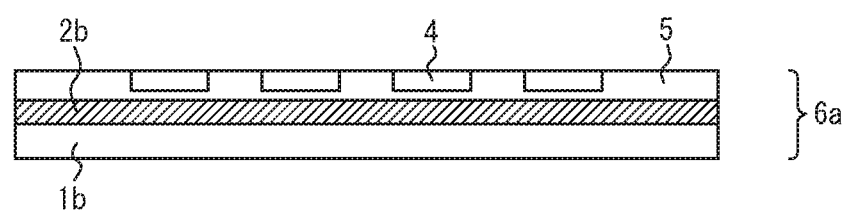

Subsequently, the support (B) 3a was attached to the polished surface of the molded resin layer 5 after separating the support (A)3a to afford a laminate (B)6b (FIG. 2C).

The exposed surface of the semiconductor chips 4 of the laminate (B)6b was coated with photosensitive resist by spin coating, heated at 120° C. for 2 minutes, and exposed at a dose of 300 mJ/cm² through a mask having a predetermined interconnection pattern. Subsequently, development was performed with a 2.38% aqueous TMAH (tetramethylammonium hydroxide) solution, followed by washing and drying. Subsequently, a Ti/Cu thin film was deposited by sputtering a Ti/Cu target. The photosensitive resist was removed with a remover, followed by washing and drying.

After the drying the laminate (B)6b, the surface of the laminate (B)6b was coated with photosensitive polyimide by spin coating and heated at 120° C. for 5 minutes.

Exposure was then performed at a dose of 500 mJ/cm² through a mask having a predetermined interconnection pattern. Subsequently, development was performed with a 2.38% aqueous TMAH solution to form a predetermined pattern. Heat treatment was then performed at 250° C. for 60 minutes to cure the photosensitive polyimide. Subsequently, a Cu pattern was formed by electroless plating, and unnecessary Cu was removed with an etching solution.

Figure 2D:
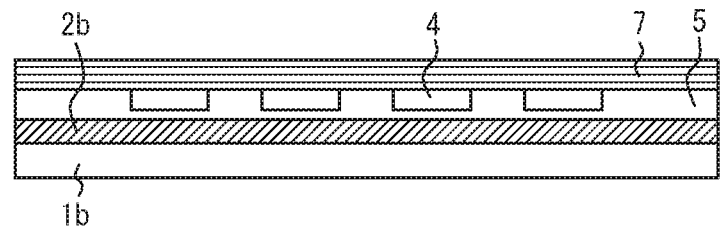

Photosensitive polyimide was applied again to the surface of the laminate (B)6b, and the same steps were repeated to form a multilayer interconnection pattern 7. Next, electroless Ni plating, electroless Au plating, and solder plating were performed on the predetermined pattern to form bumps. In this way semiconductor packages were fabricated [FIG. 2D].

Figure 2E:
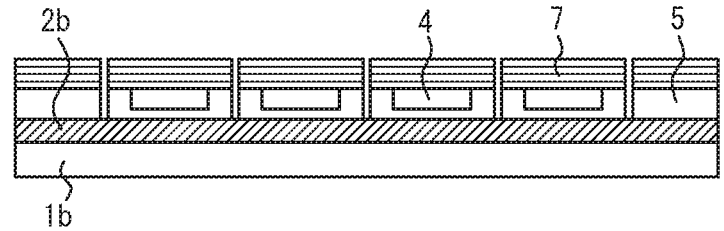
Figure 2F:

The semiconductor packages were then singulated in a dicing step [FIG. 2E], the laminate (B)6b was irradiated with UV light from the support (B)3a side, and the semiconductor packages fabricated were taken out. In this way individual semiconductor packages were obtained [FIG. 2F].

Example 2

Figure 3A:
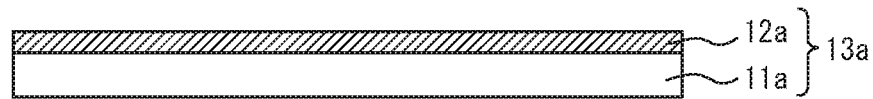
FIGS. 3A to 3H schematically show a second manufacturing process of semiconductor packages.
Figure 3B:
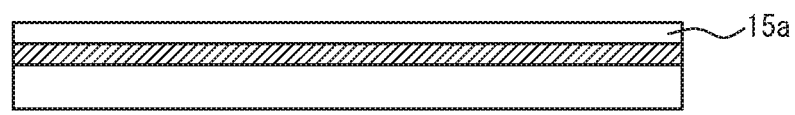

After forming an UV curable adhesive layer 12a on one side of the resin film 11a obtained in Production Example 5, the laminate was cut into a circular shape of 200 mm across, and an orientation flat was formed by cutting a part of the edge to prepare a support 13a (FIG. 3A).

Figure 3C:
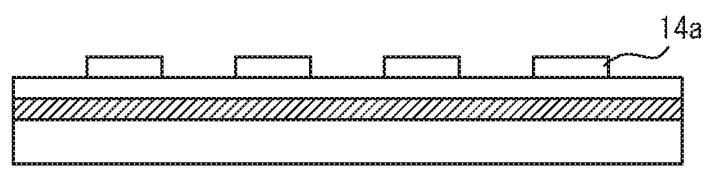
Figure 3D:
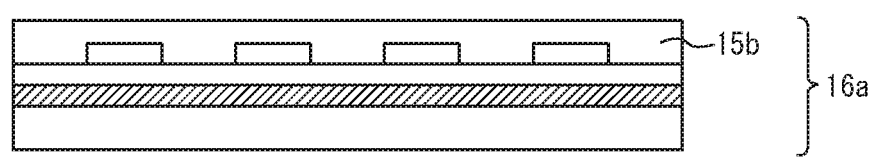

Semiconductor sealing epoxy resin was applied onto the UV curable adhesive layer of the support 13a and cured at 150° C. for 60 minutes to form a molded resin layer 15a. Semiconductor chips 14a with copper pillars were disposed face up on the molded resin layer 15a with reference to the orientation flat (FIG. 3C). After disposing the semiconductor chips 14a with copper pillars, semiconductor sealing epoxy resin was dropped onto the support 13a, compression molded at 120° C. for 10 minutes, and cured at 150° C. for 60 minutes to form a molded resin layer 15b. In this way a laminate 16a was obtained [FIG. 3D].

Figure 3E:
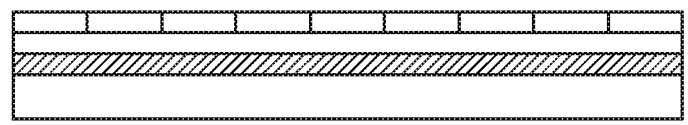

Next, the molded resin layer 15b of the laminate 16a was subjected to slurry polishing, washed with pure water, and dried at 120° for 15 minutes [FIG. 3E].

The exposed surface of the semiconductor chips 14a with copper pillars of the laminate 16a was coated with photosensitive resist by spin coating, heated at 120° C. for 2 minutes, and exposed at a dose of 300 mJ/cm² through a mask having a predetermined interconnection pattern. Subsequently, development was performed with a 2.38% aqueous TMAH solution, followed by washing and drying. Subsequently, a Ti/Cu thin film was deposited by sputtering a Ti/Cu target. The photosensitive resist was removed with a remover, followed by washing and drying.

After the drying the laminate 16a, the surface of the laminate 16a was coated with photosensitive polyimide by spin coating and heated at 120° C. for 5 minutes. Exposure was then performed at a dose of 500 mJ/cm² through a mask having a predetermined interconnection pattern. Subsequently, development was performed with a 2.38% aqueous TMAH solution to form a predetermined pattern. Heat treatment was then performed at 250° C. for 60 minutes to cure the photosensitive polyimide. Subsequently, a Cu pattern was formed by electroless plating, and unnecessary Cu was removed with an etching solution.

Figure 3F:
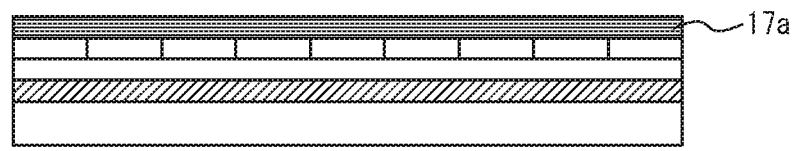

Photosensitive polyimide was applied again to the surface of the laminate 16a, and the same steps were repeated to form a multilayer interconnection pattern 17a. Next, electroless Ni plating, electroless Au plating, and solder plating were performed on the predetermined pattern to form bumps. In this way semiconductor packages were fabricated [FIG. 3F].

Figure 3G:
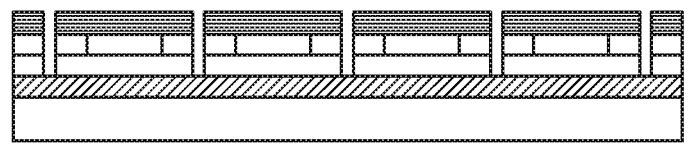
Figure 3H:

The semiconductor packages were then singulated in a dicing step [FIG. 3G], the laminate 16a was irradiated with UV light from the support 13a side, and the semiconductor packages fabricated were taken out. In this way individual semiconductor packages were obtained [FIG. 3H].

Example 3

After forming an UV curable adhesive layer on one side of the resin film obtained in Production Example 6, the laminate was cut into a square shape of 250 mm×250 mm to fabricate a support. Semiconductor chips were disposed on the support and semiconductor packages were fabricated using the same steps as those used in Example 1.

Comparative Example 1

Borosilicate glass with a thickness of 700 μm was cut into a circular shape of 150 mm across and polished to a thickness of 300 μm. Next, a UV-curable adhesive layer was formed on one side thereof to fabricate a support (C).

Semiconductor packages were fabricated using the same steps as those used in Example 1 except that the support (C) was used instead of the support (A) and support (B).

This manufacturing method has the following problems: 1) borosilicate glass is expensive; 2) it is difficult and costly to shape and polish borosilicate glass; 3) it is costly to dispose of the support after fabricating semiconductor packages; and so forth.

Comparative Example 2

In the case of fabricating a support using a polyethylene terephthalate (PET) film having a thickness of 100 μm instead of the resin film obtained in Production Example 2 and manufacturing semiconductor packages using this support, it is expected that the following problems occur:

(1) The PET film constituting the substrate layer of the support cannot withstand the heat treatment for curing the photosensitive polyimide;

(2) After washing the laminate with pure water, moisture cannot be sufficiently removed by drying at 120° C. for 15 minutes, resulting in the moisture being released from the PET film during the vacuum step in sputtering and thus contaminating the sputtering apparatus; and (3) The PET film is damaged by a plating solution used for plating or an alkaline solution used for exposing/developing, resulting in the deformation of the laminate.

REFERENCE SIGNS LIST 1a, 1b: Resin film
2a, 2b: UV curable adhesive layer
3a: Support (A), support (B)
4: Semiconductor chip
5: Molded resin layer
6a: Laminate (A)
6b: Laminate (B)
7: Redistribution layer (multilayer interconnection pattern)
11a: Resin film
12a: UV curable adhesive layer
13a: Support
14a: Semiconductor chip with copper pillar
15a: Molded resin layer
15b: Molded resin layer
16a: Laminate
17a: Redistribution layer (multilayer Interconnection pattern)

The invention claimed is:

1. A support for manufacturing semiconductor packages, comprising:
 a substrate layer; and
 an adhesive layer adjacent to the substrate layer,
 wherein the substrate layer is formed of an alicyclic structure-containing resin film,
 wherein the alicyclic structure-containing resin film comprises an alicyclic structure-containing polymer as a resin component,
 wherein the alicyclic structure-containing polymer is one having crystallinity,
 wherein the amount of the alicyclic structure-containing polymer in the alicyclic structure-containing resin film is 50% by mass or more,
 wherein the alicyclic structure-containing polymer is a polymer of dicyclopentadiene, and
 wherein the dicyclopentadiene has exo isomer and a proportion of the exo isomer is 80% or more.

2. A use of the support according to claim 1 for the manufacture of fan-out wafer level packages.

3. A method of manufacturing semiconductor packages, comprising:
 step (α) wherein a plurality of semiconductor chips is disposed on the adhesive layer of the support according to claim 1 and sealed with resin to form a laminate in which a resin layer having the plurality of semiconductor chips is formed on the support; and
 step (β) wherein the laminate obtained in the step (α) is subjected to at least one treatment selected from the group consisting of polishing, heating, exposing/developing, plating, and vacuuming.

4. The method according to claim 3, further comprising:
 step (γ) wherein after the step (β) the support and the resin layer having the plurality of semiconductor chips which constitute the laminate are separated from each other, and the resin layer having the plurality of semiconductor chips is subjected backside treatment and singulation to manufacture semiconductor packages.

5. The method according to claim 3, comprising the following step (δ) performed at least once after the step (β):
 step (δ) wherein the support and the resin layer having the plurality of semiconductor chips which constitute the laminate are separated from each other, another support for manufacturing semiconductor packages is attached to the resin layer to provide a laminate, and the laminate is subjected to at least one treatment selected from the group consisting of polishing, heating, exposing/developing, plating, and vacuuming.

6. The method according to claim 5, further comprising the following step (ε):
 step (ε) wherein after the step (δ) the support and the resin layer having the plurality of semiconductor chips which constitute the laminate are separated from each other, and the resin layer is subjected to backside treatment and singulation to manufacture semiconductor packages.

\* \* \* \* \*